(12) United States Patent
Kim et al.

(10) Patent No.: US 10,677,135 B2
(45) Date of Patent: Jun. 9, 2020

(54) EXHAUST HEAT RECOVERY SYSTEM

(71) Applicants: Hyundai Motor Company, Seoul (KR); Kia Motors Corporation, Seoul (KR)

(72) Inventors: Byung Wook Kim, Gyeonggi-do (KR); Hoo Dam Lee, Gyeonggi-do (KR); Jin Woo Kwak, Gyeongsangbuk-do (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 60 days.

(21) Appl. No.: 15/959,324

(22) Filed: Apr. 23, 2018

(65) Prior Publication Data

US 2019/0178141 A1 Jun. 13, 2019

(30) Foreign Application Priority Data

Dec. 12, 2017 (KR) .......................... 10-2017-0170439

(51) Int. Cl.
*F01N 5/02* (2006.01)
*F28D 21/00* (2006.01)
*H01L 35/30* (2006.01)

(52) U.S. Cl.
CPC ......... *F01N 5/025* (2013.01); *F28D 21/0003* (2013.01); *H01L 35/30* (2013.01); *F01N 2240/02* (2013.01); *F01N 2470/08* (2013.01)

(58) Field of Classification Search
CPC .. F01N 5/025; F01N 2240/02; F01N 2470/08; F28D 21/0003; H01L 35/30
See application file for complete search history.

(56) References Cited

U.S. PATENT DOCUMENTS

| | | | |
|---|---|---|---|
| 2005/0028858 A1* | 2/2005 | Rossi | H01L 35/06 136/205 |
| 2010/0281866 A1* | 11/2010 | Reynolds | F01N 13/009 60/686 |
| 2011/0083831 A1* | 4/2011 | Richter | F01N 5/025 165/120 |
| 2012/0073276 A1* | 3/2012 | Meisner | H01L 35/30 60/320 |
| 2014/0318481 A1* | 10/2014 | Iriyama | F25B 21/00 123/2 |
| 2015/0075160 A1* | 3/2015 | An | F01N 5/025 60/605.1 |
| 2015/0333245 A1* | 11/2015 | Iriyama | F01N 5/025 136/205 |

FOREIGN PATENT DOCUMENTS

JP 2016109018 A * 6/2016
KR 10-2017-0080029 7/2017

* cited by examiner

*Primary Examiner* — Matthew T Largi
(74) *Attorney, Agent, or Firm* — Mintz Levin Cohn Ferris Glovsky and Popeo, P.C.; Peter F. Corless

(57) ABSTRACT

An exhaust heat recovery system is provided. The system includes a branch pipe that has branch fluid passages that are formed to be connected with an exhaust gas source emitting emit exhaust gas. a valve at least partially opens or closes the branch fluid passages to selectively introduce the exhaust gas into at least one of the branch fluid passages. Additionally, a thermoelectric module performs thermoelectric power generation by selectively using exhaust heat of the exhaust gas passing through a specific branch fluid passage of the branch fluid passages.

12 Claims, 8 Drawing Sheets

EXHAUST HEAT RECOVERY SYSTEM

CROSS-REFERENCE TO RELATED APPLICATION

This application is based on and claims the benefit of priority to Korean Patent Application No. 10-2017-0170439, filed on Dec. 12, 2017, in the Korean Intellectual Property Office, the disclosure of which is incorporated herein in its entirety by reference.

TECHNICAL YIELD

The present disclosure relates to an exhaust heat recovery system, and more particularly, to an exhaust heat recovery system that provides an improved and more compact structure.

BACKGROUND

In general, exhaust heat of exhaust gas emitted from an engine of a vehicle is regarded as unnecessary heat, that is, waste heat, having a lower utility value and is abandoned into the air. The exhaust heat of the exhaust gas is a substantial amount of energy that occupies about 30% of the total calorific value of fuel and is gradually increased in terms of a utility value. Accordingly, recently, various types of exhaust heat recovery devices have been used, such as, a heater which is able to heat the interior of a vehicle using the exhaust heat of the exhaust gas, a warmer, which is able to warm up coolant or oil using the exhaust heat of the exhaust gas, and a thermoelectric module which is able to perform thermoelectric power generation using the exhaust heat of the exhaust gas.

In general, exhaust heat recovery devices have mutually different temperature characteristics in a driving temperature or an endurance temperature. Accordingly, to efficiently recover exhaust heat of exhaust gas, various types of exhaust heat recovery devices have been installed within a vehicle. However, conventionally, since an exhaust heat recovery system has not been developed in which the various types of exhaust heat recovery devices are integrated with each other, the exhaust heat recovery devices are occupied at an excessively large percentage based on the whole volume of the vehicle, and the number of parts (e.g., a valve necessary for the switch of a fluid passage of the exhaust gas) for installing the exhaust heat recovery devices is excessively increased.

SUMMARY

The present disclosure has been made to solve the above-mentioned problems occurring in the prior art while advantages achieved by the prior art are maintained intact. An aspect of the present disclosure provides an exhaust heat recovery system improved to have a more compact structure. Another aspect of the present disclosure provides an exhaust heat recovery system improved to selectively change a manner of recovering exhaust heat based on an environment condition, such as a driving time or a driving aspect, of a vehicle. The technical problems to be solved by the present disclosure are not limited to the aforementioned problems, and any other technical problems not mentioned herein will be clearly understood from the following description by those skilled in the art to which the present disclosure pertains.

According to an aspect of the present disclosure, an exhaust heat recovery system may include a branch pipe that has branch fluid passages formed to be connected with an exhaust gas source emitting emit exhaust gas, a valve configured to at least partially open or close the branch fluid passages to selectively introduce the exhaust gas into at least one of the branch fluid passages, and a thermoelectric module configured to perform thermoelectric power generation by selectively using exhaust heat of the exhaust gas passing through a specific branch fluid passage of the branch fluid passages.

In particular, the branch pipe may further include an outer wall having an exhaust fluid passage formed in the outer wall, and a partition that partitions the exhaust fluid passage into the branch fluid passages. The thermoelectric module may be coupled to a particular position of the outer wall to receive the exhaust heat of the exhaust gas passing through the specific branch fluid passage. The branch fluid passages include inlets connected with the exhaust gas source, respectively, and the valve may be configured to selectively open the inlet of at least one of the branch fluid passages while selectively closing remaining branch fluid passages of the branch fluid passages except for the at least one branch fluid passage.

Additionally, the valve may include a cover plate provided to selectively cover the inlets of the remaining branch fluid passages to thus close the inlets. The branch fluid messages may be arranged radially from the central portion of the branch pipe, and the cover plate has a sector shape. The valve may further include a driving motor configured to pivotally drive the cover plate about the central portion of the branch pipe. The branch fluid passages may have a first branch fluid passage and a second branch fluid passage, and the thermoelectric module may be configured to perform the thermoelectric power generation using the exhaust heat of the exhaust gas passing through the first branch fluid passage.

Further, the exhaust heat recovery system may include a cooling fluid pipe through which a cooling fluid passes, and the cooling fluid pipe may include a first section disposed such that the thermoelectric module and the cooling fluid exchange heat with each other. The cooling fluid pipe may further include a second section disposed such that the exhaust gas passing through the second branch fluid passage and the cooling fluid exchange heat with each other. The exhaust heat recovery system may further include a controller configured to operate the valve. In particular, the controller may be configured to close the first branch fluid passage while the second branch fluid passage is opened, when a temperature of the cooling fluid is less than a predetermined reference warm-up temperature.

In addition, the controller may be configured to open the first branch fluid passage while the second branch fluid passage is closed, when the temperature of the cooling fluid is equal to or greater than the predetermined reference warm-up temperature. The controller may be configured to operate the valve such that a portion of the first branch fluid passage and a portion of the second branch fluid passage are opened, when the temperature of the cooling fluid is equal to or greater than a predetermined first mode switch temperature and is less than the predetermined reference warm-up temperature. Further, the controller may be configured to operate the valve such that an open rate of a first inlet generally increases while an open rate of a second inlet gradually decreases, as the temperature of the cooling fluid approximates the predetermined reference warm-up temperature.

The branch fluid passages may further include a third branch fluid passage, and the controller may be configured to open the third fluid passage is opened while the first branch fluid passage and the second branch fluid passage are closed, when a temperature of the thermoelectric module is equal to or greater than a predetermined reference power generation limit temperature. Additionally, the controller may be configured to operate the valve such that a portion of the first branch fluid passage and a portion of the third branch fluid passage are opened while a remaining portion of the first branch fluid passage, a remaining portion of the third branch fluid passage, and the second branch fluid passage are closed, when the temperature of the thermoelectric module is equal to or greater than the predetermined reference power generation limit temperature and is equal to less than a second mode switch temperature.

The controller may further be configured to operate the valve such that an open amount of a first inlet gradually decreases while an open amount of a third inlet gradually increases, as the temperature of the thermoelectric module approximates the second mode switch temperature. The first branch fluid passage, the second branch fluid passage, and the third branch fluid passage may be arranged radially from the central portion of the branch pipe.

BRIEF DESCRIPTION OF THE DRAWINGS

The above and other objects, features and advantages of the present disclosure will be more apparent from the following detailed description taken in conjunction with the accompanying drawings.

DETAILED DESCRIPTION

Figure 1:
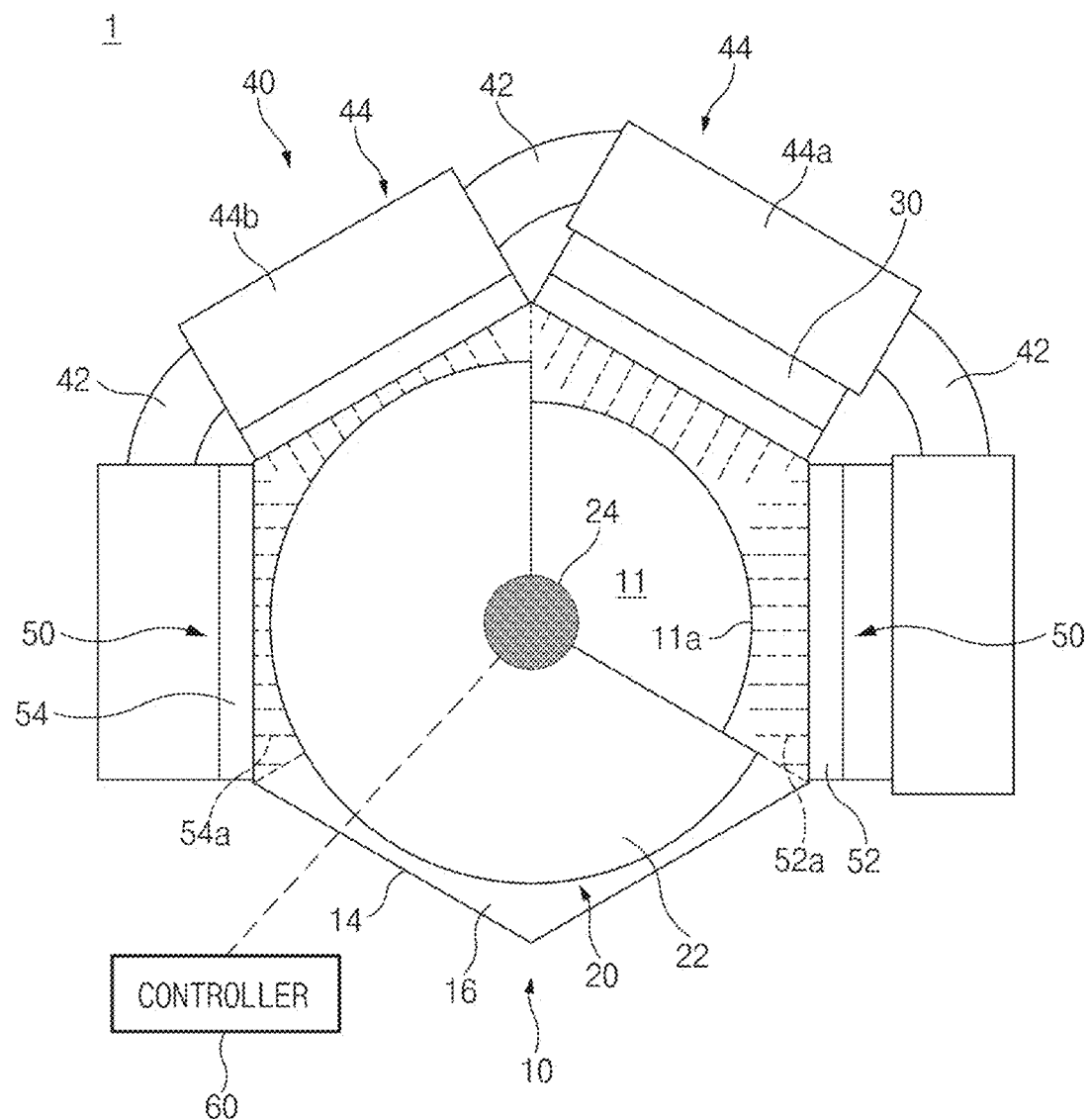
FIG. 1 is a front view of an exhaust heat recovery system, according to an exemplary embodiment of the present disclosure.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, combustion, plug-in hybrid electric vehicles, hydrogen-powered vehicles and other alternative fuel vehicles (e.g. fuels derived from resources other than petroleum).

Although exemplary embodiment is described as using a plurality of units to perform the exemplary process, it is understood that the exemplary processes may also be performed by one or plurality of modules. Additionally, it is understood that the term controller/control unit refers to a hardware device that includes a memory and a processor. The memory is configured to store the modules and the processor is specifically configured to execute said modules to perform one or more processes which are described further below.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/of" includes any and all combinations of one or more of the associated listed items.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

Hereinafter, exemplary embodiments of the present disclosure will be described in detail with reference to the accompanying drawings. In the following description, the same reference numerals will be assigned to the same elements even though the elements are illustrated in different drawings. In addition, in the following description of the embodiment of the present disclosure, a detailed description of well-known features or functions will be ruled out in order not to unnecessarily obscure the gist of the present disclosure.

In the following description of elements according to an embodiment of the present disclosure, the terms 'first', 'second', 'A', '(a)', and '(b)' may be used. The terms are used only to distinguish relevant elements from other elements, and the nature, the order, or the sequence of the relevant elements is not limited to the terms. In addition, unless otherwise defined, all terms used herein, including technical or scientific terms, have the same meanings as those generally understood by those skilled in the art to which the present disclosure pertains. Such terms as those defined in a generally used dictionary are to be interpreted as having meanings equal to the contextual meanings in the relevant field of art, and are not to be interpreted as having ideal or excessively formal meanings unless clearly defined as having such in the present application.

Figure 2:
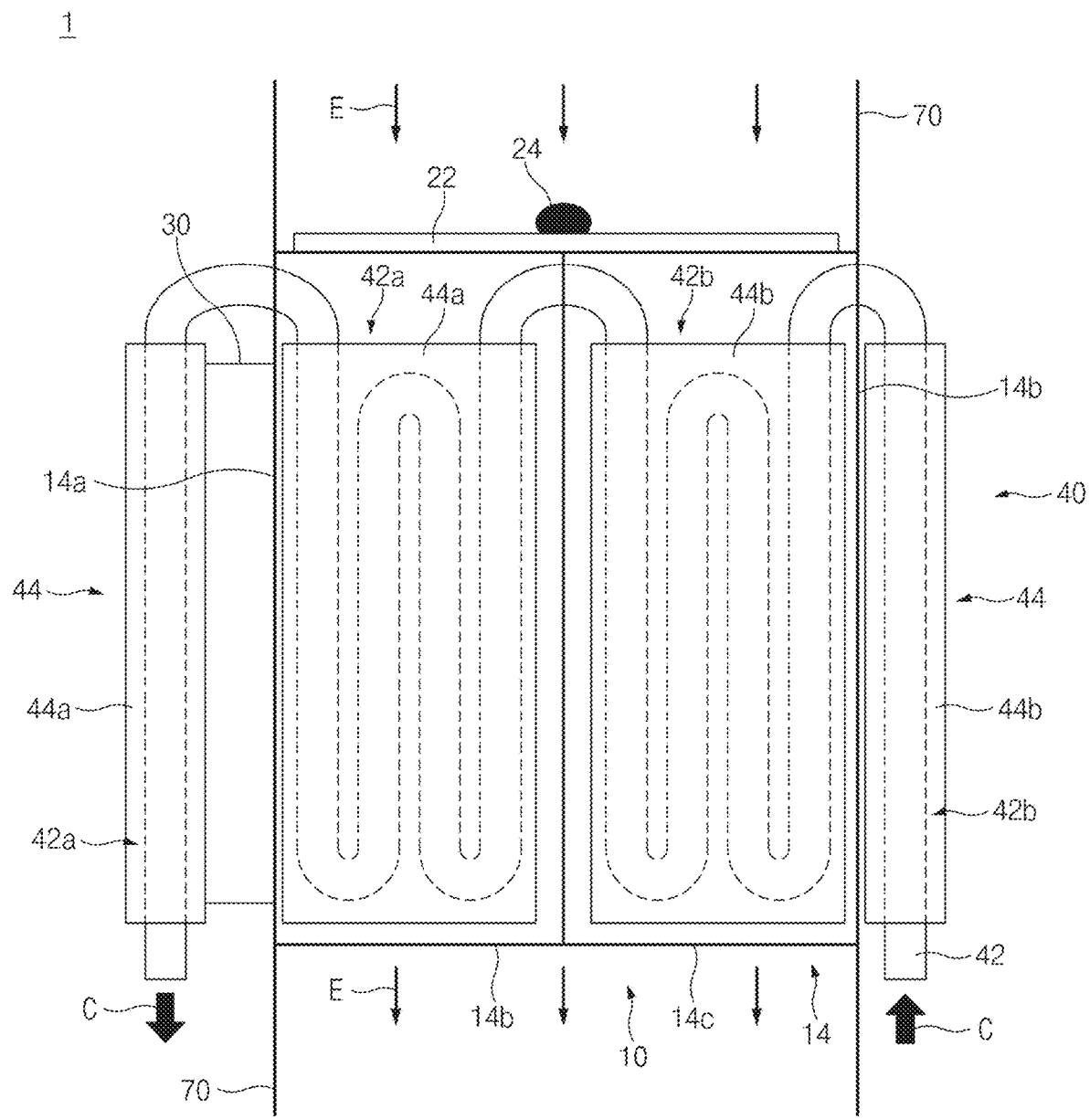
FIG. 2 is a plan view of the exhaust heat recovery system illustrated in FIG. 1 according to an exemplary embodiment of the present disclosure.
Figure 3:
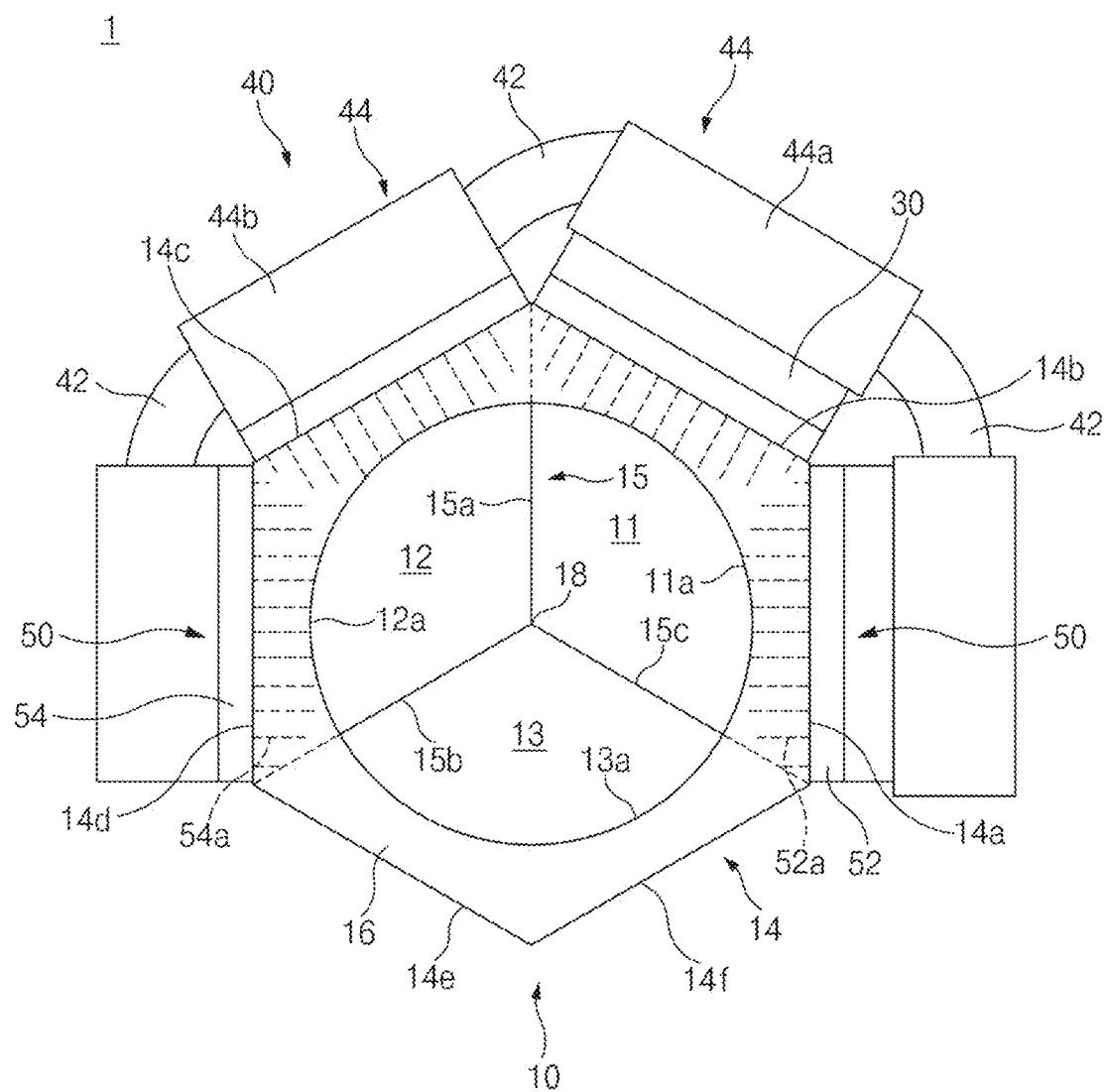
FIG. 3 is a front view of a branch pipe illustrated in FIG. 1 according to an exemplary embodiment of the present disclosure.
Figure 4:
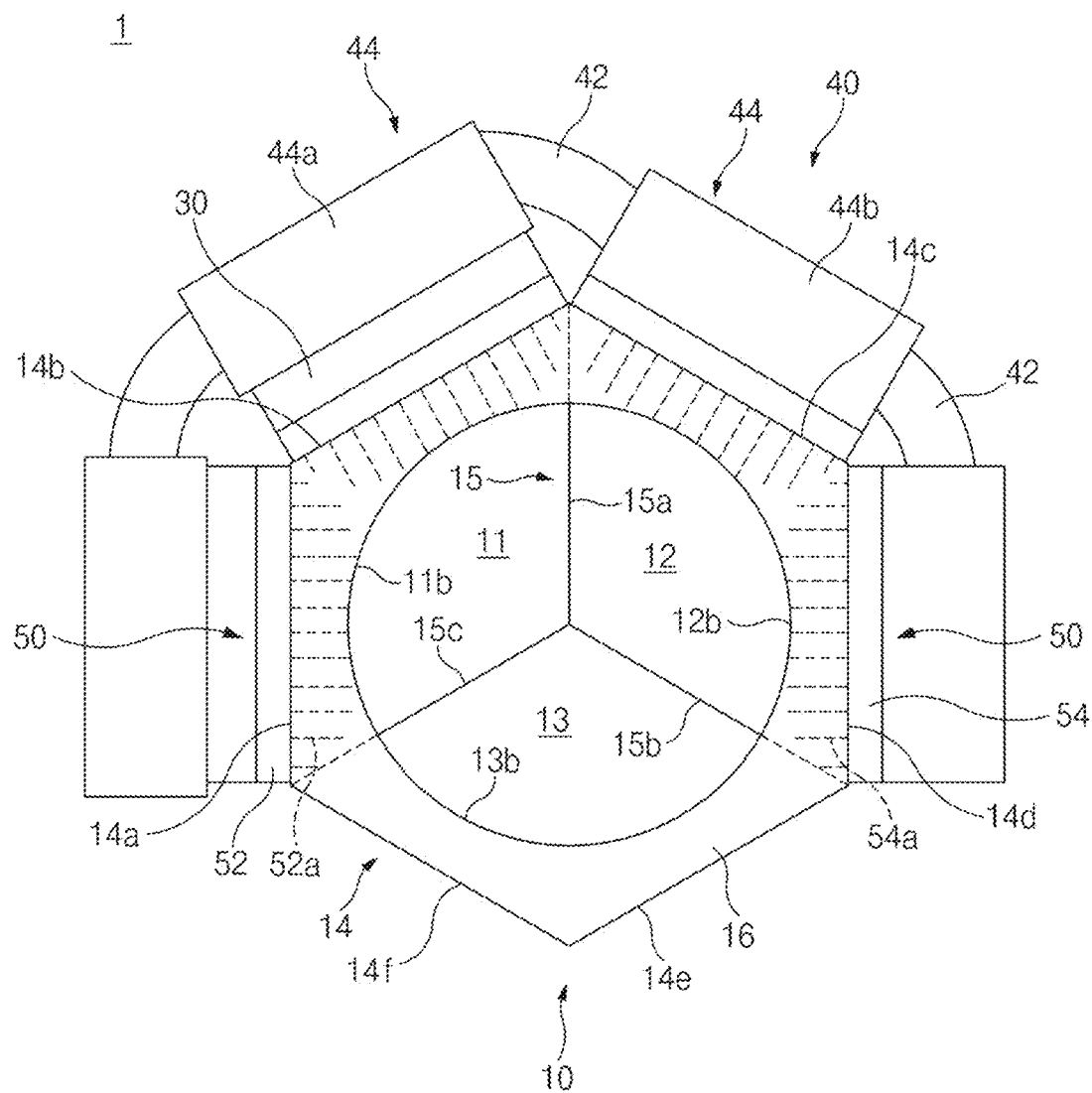
FIG. 4 is a rear view illustrating a branch pipe illustrated in FIG. 1 according to an exemplary embodiment of the present disclosure.

FIG. 1 is a front view of an exhaust heat recovery system, according to an exemplary embodiment of the present disclosure, FIG. 2 is a plan view of the exhaust heat recovery system illustrated in FIG. 1, FIG. 3 is a front view of a branch pipe illustrated in FIG. 1, and FIG. 4 is a rear view of a branch pipe illustrated in FIG. 1.

Referring to FIGS. 1 to 4, an exhaust heat recovery system 1 according to an exemplary embodiment of the present disclosure may include a branch pipe 10 having a plurality of branch fluid passages 11, 12, and 13 formed therein and connected with an exhaust gas source which emits exhaust gas E, a valve, configured to open or close the branch fluid passages 11, 12, and 13 to selectively introduce the exhaust gas E into at least one of the branch fluid passages 11, 12, and 13, a thermoelectric module 30, configured to perform thermoelectric power generation using exhaust heat of the exhaust gas E, a cooling member 40 configured to allow a cooling fluid C to pass through the cooling member 40, and a heat exchanger 50 configured to transmit the exhaust heat of the exhaust gas E to the thermoelectric module 30 or the cooling member 40. The type of the exhaust gas source which allows the exhaust heat recovery system 1 to recover the exhaust heat of the exhaust gas E is not specially limited. For example, the exhaust gas source may be an engine of a vehicle. Hereinafter, the present disclosure will be described while focusing on the case that the exhaust gas source is the engine of the vehicle by way of example.

As illustrated in FIG. 2, the branch pipe 10 may be installed on the middle path of an exhaust pipe 70, which is used to discharge an exhaust gas E, which is produced by the engine of the vehicle, out of the vehicle. The exhaust gas E passing through the exhaust pipe 70 may be discharged out of the vehicle through the branch pipe 10. The branch fluid passages 11, 12, and 13 may be formed inside the branch pipe 10. For example, as illustrated in FIG. 3, a first branch fluid passage 11 to a third branch passage 13 may be formed inside the branch pipe 10. Each of the first branch fluid passage 11 to the third branch fluid passage 13 is configured such that the exhaust gas E, which flows along the exhaust pipe 70, passes through the relevant branch fluid passage.

For example, as illustrated in FIGS. 3 and 4, the first branch fluid passage 11 may include a first inlet 11a formed in a first end portion of the first branch fluid passage 11 to introduce the exhaust gas E flowing along the exhaust pipe 70 into the first branch fluid passage 11, and a first outlet 11b formed in a second end portion of the first branch fluid passage 11 (e.g., an opposite end from the first end) to re-introduce the exhaust gas E passing through the first branch fluid passage 11 into the exhaust pipe 70. For example, as illustrated in FIGS. 3 and 4, the second branch fluid passage 12 may include a second inlet 12a formed in a first end portion of the second branch fluid passage 12 to introduce the exhaust gas E flowing along the exhaust pipe 70 into the second branch fluid passage 12, and a second outlet 12b formed in a second end portion of the second branch fluid passage 12 (e.g., an opposite end from the first end) to re-introduce the exhaust gas E passing through the second branch fluid passage 12 into the exhaust pipe 70.

For example, as illustrated in FIGS. 3 and 4, the third branch fluid passage 13 may include a third inlet 13a formed in a first end portion of the third branch fluid passage 13 to introduce the exhaust gas E flowing along the exhaust pipe 70 into the third branch fluid passage 13, and a third outlet 13b formed in a second end portion of the third branch fluid passage 13 (e.g., an opposite end from the first end) to re-introduce the exhaust gas E passing through the third branch fluid passage 13 into the exhaust pipe 70. The manner of forming the branch fluid passages 11, 12, and 13 inside the branch pipe 10 is not spatially limited. For example, as illustrated in FIGS. 3 and 4, the branch pipe 10 may include an outer wall 14 having an exhaust fluid passage formed therein and a partition 15 which divides the exhaust fluid passage of the outer wall 14 to form the branch fluid passages 11, 12, and 13.

As illustrated in FIGS. 2 and 3, the outer wall 14 has the shape of a pipe having the exhaust fluid passage formed therein. The outer wall 14 may have the shape of a polygon section. For example, as illustrated in FIG. 3, the outer wall 14 may have a first outer wall 14a to a sixth outer wall 14f arranged such that the outer wall 14 has the shape of a regular hexagonal section. The partition 15 may be disposed inside the outer wall 14 to divide the exhaust fluid passage of the outer wall 14 into the branch fluid passages 11, 12, and 13. For example, as illustrated in FIG. 3, the partition 15 may include a first partition 15a to a third partition 15c disposed inside the outer wall 14 to divide the exhaust fluid passage of the outer wall 14 into the first branch fluid passage 11 to the third branch fluid passage 13.

As illustrated in FIG. 3, the first partition 15a to the third partition 15c may be arranged radially from the central portion 18 of the branch pipe 10. Then, the first branch fluid passage 11 to the third branch fluid passage 13 may be arranged radially from the central portion 18 of the branch pipe 10 to interpose the third branch fluid passage 13 between the first branch fluid passage 11 and the second branch fluid passage 12.

In addition, the first partition 15a to the third partition 15c may be radially arranged at an angle of about 120° relative to one another such that the first branch fluid passage 11 to the third branch fluid passage 13 have the same sectional area. Thus, the first branch fluid passage 11 may be formed to be surrounded by the first outer wall 14a, the second outer wall 14b, the first partition 15a, and the third partition 15c. In addition, the second branch fluid passage 12 may be formed to be surrounded by the third outer wall 14c, the fourth outer wall 14d, the first partition 15a, and the second partition 15b. The third branch fluid passage 13 may be formed to be surrounded by the fifth outer wall 14e, the sixth outer wall 14f, the second partition 15b, and the third partition 15c.

Moreover, the inlets 11a, 12a, and 13a and the outlets 11b, 12b, and 13b of the branch fluid passages 11, 12, and 13 may be formed to have curved shapes. Accordingly, a first wall 16 may be formed through a first end portion of the branch pipe 10 to combine the shapes of the first inlet 11a to the third inlet 13a with each other to form a circular shape. Correspondingly to the first wall 16, as illustrated in FIG. 4, a second wall 17 may be formed through a second end portion of the branch pipe 10 (e.g., an opposite end from the first end) to combine the shapes of the first inlet 11b to the third inlet 13b with each other to form a circular shape.

a valve 20 may be configured to selectively open or close the branch fluid passages 11, 12, and 13 to selectively introduce the exhaust gas E flowing along the exhaust pipe 70 into at least one of the branch fluid passages 11, 12, and 13. The structure of the valve 20 is not specially limited. For example, as illustrated in FIG. 1, the valve 20 may include a cover plate 22, which is provided to selectively cover some of the inlets 11a, 12a, and 13a such that the some inlets are capable of being closed, and a driving motor 24 configured to pivotally drive the cover plate 22. In particular, the cover plate 22 may have the shape of a sector. For example, as illustrated in FIG. 1, the cover plate 22 may have the shape of a sector having an area that corresponds to two of the inlets 11a, 12a, and 13a of the branch fluid passages 11, 12, and 13 to cover the two inlets. In other words, the cover plate 22 may have the shape of a sector spread at an angle of about 240° to simultaneously cover two of the inlets 11a, 12a, and 13a.

As illustrated in FIGS. 1 and 3, the cover plate 22 may be pivotably mounted on a first end portion of the branch pipe 10 to align the central portion of the cover plate 22 with the central portion of the branch pipe 10. As illustrated in FIG. 1, the driving motor 24 may be axially coupled to the central portion of the cover plate 22 to pivotably drive the cover plate 22. The driving motor 24 may be disposed to pivot the cover plate 22 in a forward direction or a reverse direction to completely open any one of the inlets 11a, 12a, and 13a while completely closing remaining two of the inlets 11a, 12a, and 13a or to partially open two of the inlets 11a, 12a, and 13a while completely closing remaining one of the inlets 11a, 12a, and 13a. Then, the exhaust gas E flowing along the exhaust pipe 70 may be selectively introduced into at least one of the branch fluid passages 11, 12, and 13 through at least one of the inlets 11a, 12a, and 13a, which is opened by the cover plate 22.

Further, the thermoelectric module 30 may be configured to perform thermoelectric power generation by a Seebeck effect of generating electromotive force due to the difference in temperature between both ends of a thermoelectric device. The thermoelectric module 30 may include thermoelectric devices (not illustrated), each of which may be configured to perform thermoelectric power generation using the difference in temperature between both ends, and electrodes (not illustrated) which connect the thermoelectric devices with each other or are connected with an external electric device. Since the thermoelectric module 30 has the same structure as that of a typical thermoelectric module, the details of the structure of the thermoelectric module 30 will be omitted.

The thermoelectric module 30 may be configured to perform thermoelectric power generation using the exhaust heat of the exhaust gas E passing through specific branch fluid passages of the branch fluid passages 11, 12, and 13. For example, the thermoelectric module 30 may be installed to perform the thermoelectric power generation using the exhaust heat of the exhaust gas E passing through the first branch fluid passages 11. Accordingly, as illustrated in FIG. 1, the thermoelectric module 30 may be seated on a first heat exchanger 52 such that a first end of each of the thermoelectric devices thermally make contact with the first heat exchanger 52 to be described. Then, the exhaust heat of the exhaust gas E passing through the first branch fluid passage 11 may be transmitted to the first ends of the thermoelectric devices through the first heat exchanger 52.

The number of thermoelectric modules 30 installed is not specially limited. For example, as illustrated in FIG. 1, a pair of thermoelectric modules 30 may be installed with first ends of the thermoelectric devices are seated on one of first heat exchangers 52. The thermoelectric module 30 may be configured to perform the thermoelectric power generation using the exhaust gas E passing through the first branch fluid passage 11 as a heat source. The details of the thermoelectric power generation using the thermoelectric module 30 will be described below.

Furthermore, although the thermoelectric module 30 has been described with first ends of the thermoelectric devices thermally making contact with the first heat exchanger 52, the present disclosure is not limited thereto. In other words, the thermoelectric module 30 may be seated on at least one of the first outer wall 14a and the second outer wall 14b such that first ends of the thermoelectric devices thermally make contact with at least one of the first outer wall 14a and the second outer wall 14b.

Additionally, the cooling member 40 may operate as a warmer configured to heat a cooling fluid C using the exhaust heat of the exhaust gas E or operate as a cold source to perform the thermoelectric power generation using the thermoelectric module 30. Accordingly, as illustrated in FIG. 2, the cooling member 40 may include a cooling fluid pipe 42 through which the cooling fluid C passes and a cooling jacket 44 to allow the cooling fluid pipe 42 to thermally make contact with the thermoelectric module 30 or a second heat exchanger 54 to be described.

The cooling fluid pipe 42 may be connected with an external cooling fluid supply source (not illustrated) to allow cooling fluid C supplied from the external cooling fluid supply source to pass through the cooling fluid pipe 42 along a specific path. The type of the cooling fluid C is not specially limited. For example, the cooling fluid C may be a coolant circulating an engine. As illustrated in FIGS. 1 and 2, the cooling fluid pipe 42 may have a first section 42a disposed to exchange heat with the thermoelectric module 30 and a second section 42b disposed to exchange heat with the second heat exchanger 54.

Additionally, the first section 42a and the second section 42b may be connected with each other in series to allow the cooling fluid C from the cooling fluid supply source to sequentially pass through the first section 42a and the second section 42b and to be retransmitted to the cooling fluid supply source again. In particular, the first section 42a and the second section 42b may be provided in such a manner that the second section 42b is disposed at a position upper than that of the first section 42a to allow the cooling fluid C to enter the first section 42a when the cooling fluid C is first heated in the second section 42b, but the present disclosure is not limited thereto.

As illustrated in FIG. 2, the cooling jacket 44 may include a first cooling jacket 44a, which brings the first section 42a of the cooling fluid pipe 42 into thermal contact with the thermoelectric module 30, and a second cooling jacket 44b which brings the second section 42b of the cooling fluid pipe 42 into contact with the second heat exchanger 54. As illustrated in FIGS. 1 and 2, the first cooling jacket 44a may be formed such that the first section 42a of the cooling fluid pipe 42 is buried in the first cooling jacket 44a and may be seated on the thermoelectric module 30 to thermally make contact with opposite ends of the thermoelectric devices. The number of first cooling jackets 44a installed is not specially limited. For example, as illustrated in FIG. 1, each of a pair of first cooling jackets 44a may be seated on any one thermoelectric module 30.

The first cooling jacket 44a may bring the first section 42a of the cooling fluid pipe 42 into contact with the opposite ends of thermal electric devices disposed in the thermoelectric module 30. Accordingly, the opposite ends of the thermoelectric devices may be cooled by the cooling fluid C passing through the first section 42a of the cooling fluid pipe 42 to have a temperature that is less than that of the first ends of the thermoelectric devices. Accordingly, the thermoelectric module 30 may be configured to perform the thermoelectric power generation using the difference in temperature between both ends of the thermoelectric device, which is made by the exhaust gas E passing through the first branch fluid passage 11 and the cooling fluid C passing through the cooling fluid pipe 42, thereby recovering the exhaust heat of the exhaust gas E passing through the first branch fluid passage 11.

As illustrated in FIGS. 1 and 2, the second cooling jacket 44b may be formed such that the second section 42b of the cooling fluid pipe 42 is buried in the second cooling jacket 44b and may be seated on the second heat exchanger 54 to thermally make contact with the second heat exchanger 54 to be described below. The number of second cooling jackets 44b installed is not specially limited. For example, as illustrated in FIG. 1, each of a pair of second cooling jackets 44b may be seated on any one second heat exchanger 54.

The second cooling jacket 44b may bring the second section 42b of the cooling fluid pipe 42 into thermal contact with the second heat exchanger 54. Then, the exhaust heat of the exhaust gas E passing through the second branch fluid passage 12 may be transmitted to the cooling fluid C, which passes through the second section 42b of the cooling fluid pipe 42, through the second heat exchanger 54, the second cooling jacket 44b, and the second section 42b of the cooling fluid pipe 42. Accordingly, the cooling fluid C passing through the second section 42b of the cooling fluid pipe 42 may be heated by the exhaust gas E passing through the second branch fluid passage 12. Since the cooling fluid C heated using the exhaust heat of the exhaust gas E is used as the cold source of the thermoelectric module 30 by the cooling member 40, the volume, the weight, and the installation costs of the exhaust heat recovery system 1 may be further reduced compared with when the cold source of the thermoelectric module 30 is provided separately.

Furthermore, the heat exchanger 50 may be configured to transmit the exhaust heat of the exhaust gas E passing through the first branch fluid passage 11 to the thermoelectric module 30 or to transmit the exhaust heat of the exhaust gas E passing through the second fluid passage 12 to the cooling member 40. For example, as illustrated in FIG. 1, the heat exchanger 50 may include the first heat exchanger 52, interposed between the outer wall 14 of the branch pipe 10 and the thermoelectric module 30, and the second heat exchanger 54 interposed between the outer wall 14 of the branch pipe 10 and the second cooling jacket 44b of the cooling member 40.

As illustrated in FIG. 3, a pair of first heat exchangers 52 may be installed to be interposed between the first outer wall 14a and one thermoelectric module 30 and between the second outer wall 14b and another thermoelectric module 30. Each of the first heat exchangers 52 may include heat exchange fines 52a inserted into the first branch fluid passage 11 through the first outer wall 14a or the second outer wall 14b. Accordingly, each first heat exchanger 52 may be configured to absorb exhaust heat of the exhaust gas E, which passes through the first branch fluid passage 11, using the heat exchange fines 52a and may be configured to transmit the exhaust heat to the first ends of the thermoelectric devices disposed in the thermoelectric module 30.

As illustrated in FIG. 3, a pair of second heat exchangers 54 may be installed to be interposed between the third outer wall 14c and one second cooling jacket 44b and between the fourth outer wall 14d and another second cooling jacket 44b. Each of the second heat exchangers 54 may include heat exchange fins 54a inserted into the second branch fluid passage 12 through the third outer wall 14c or the fourth outer wall 14d. Accordingly, each of the second heat exchangers 54 may be configured to absorb exhaust heat of the exhaust gas E, which passes through the second branch fluid passage 12, using the heat exchange fines 54a. The exhaust heat of the exhaust gas E absorbed by the second heat exchangers 54 may be transmitted to the cooling fluid C, which passes through the second section 42b of the cooling fluid pipe 42, through the second cooling jacket 44b, and the second section 42b of the cooling fluid pipe 42.

FIGS. 5 to 8 are views illustrating a manner of recovering exhaust heat using the exhaust heat recovery system illustrated in FIG. 1. Hereinafter, the manner of recovering the exhaust heat using the exhaust heat recovery system 1 will be described with reference to FIGS. 5 to 8.

Figure 5:
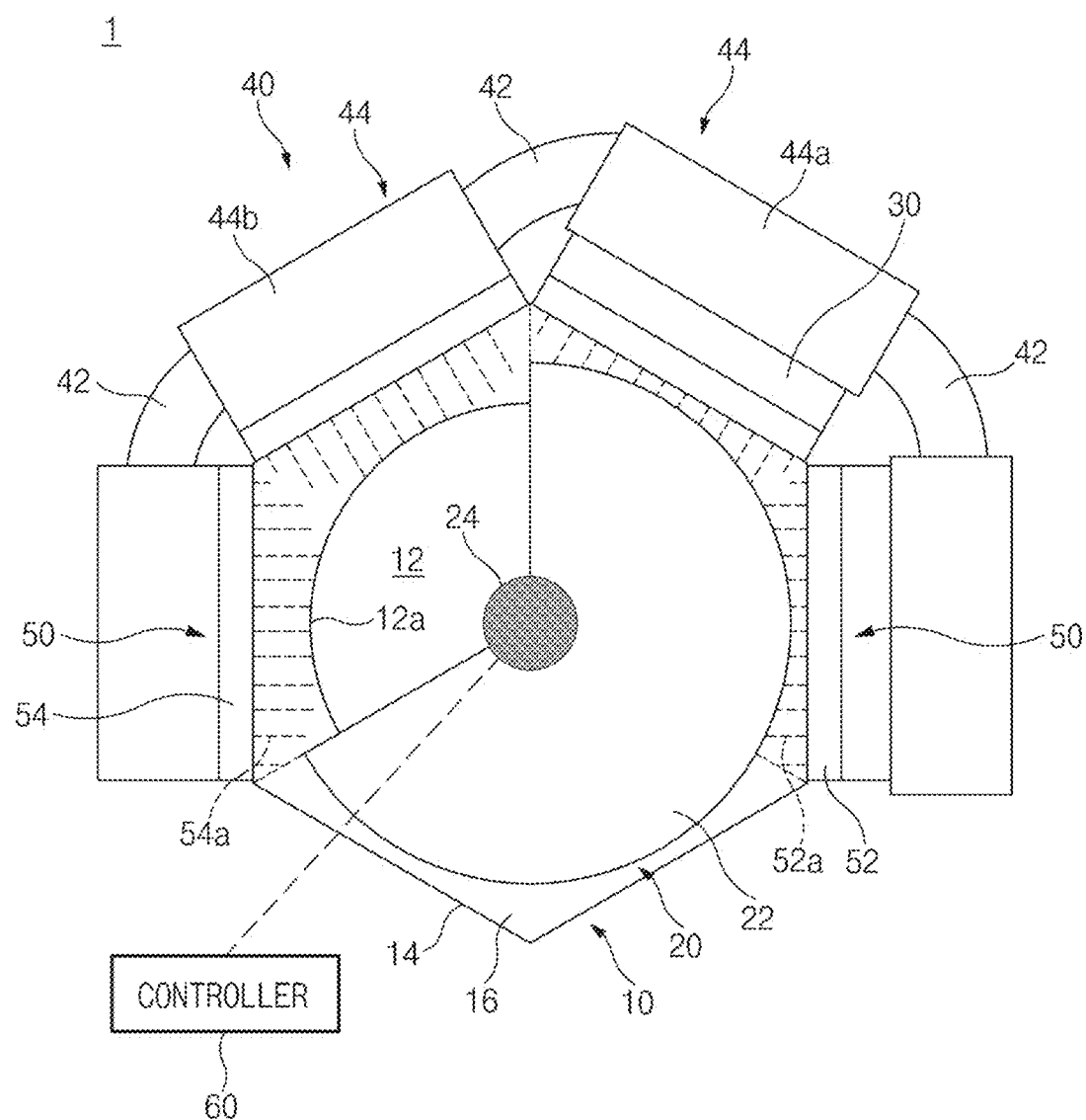
FIGS. 5 to 8 are views illustrating a manner of recovering exhaust heat using the exhaust heat recovery system illustrated in FIG. 1 according to an exemplary embodiment of the present disclosure.

First, referring to FIG. 5, a controller 60 of the exhaust heat recovery system 1 may be configured to operate the valve 20 to close the first inlet 11a and the third inlet 13a while opening the second inlet 12a, when a temperature of the cooling fluid C passing through the cooling fluid pipe 42 is less than a predetermined reference warm-up temperature (e.g., a cooling fluid warm-up mode). The exhaust gas E flowing along the exhaust pipe 70 may then be re-transmitted to the exhaust pipe 70 through the second outlet 12b after being selectively introduced into the second branch fluid passage 12 through the second inlet 12a. In the cooling fluid warm-up mode, the cooling fluid C passing through the second section 42b of the cooling fluid pipe 42 may be heated by the exhaust gas E passing through the second branch fluid passage 12.

The reference warm-up temperature is not specially limited. For example, when the cooling fluid C passing through the cooling fluid pipe 42 is coolant, the temperature of the cooling fluid C suitable for operating an engine may be determined as the reference warm-up temperature. Although it is preferred that the temperature of the cooling fluid C passing through the cooling fluid pipe 42 is sensed by a temperature sensor (not illustrated) installed in the cooling fluid pipe 42, the present disclosure is not limited thereto.

Further, in the cooling fluid warm-up mode, when the temperature of the cooling fluid C is less than the reference warm-up temperature as in the cold start-up of the engine, the cooling fluid C may be heated using the exhaust heat of the exhaust gas E passing through the second branch fluid passage 12 to increase the temperature of the cooling fluid C to the reference warm-up temperature, thereby recovering the exhaust heat of the exhaust gas E.

Referring to FIG. 1, when the temperature of the cooling fluid C passing through the cooling fluid pipe 42 is equal to or greater than the specific reference warm-up temperature, the controller 60 may be configured to operate the valve 20 to open the first inlet 11a while the second inlet 12a and the third inlet 13a (thermoelectric power generation mode) are closed. Then, the exhaust gas E flowing along the exhaust pipe 70 may be re-transmitted to the exhaust pipe 70 through the first outlet 11b after being selectively introduced into the first branch fluid passage 11 through the first inlet 11a. In the thermoelectric power generation mode, the thermoelectric power generation may be performed using the difference in temperature between both ends of the thermoelectric devices, which is generated by the exhaust gas E and the cooling fluid C to recover the exhaust heat of the exhaust gas E in the form of energy, thereby improving the recovery rate of the exhaust heat of the exhaust gas E.

Figure 6:
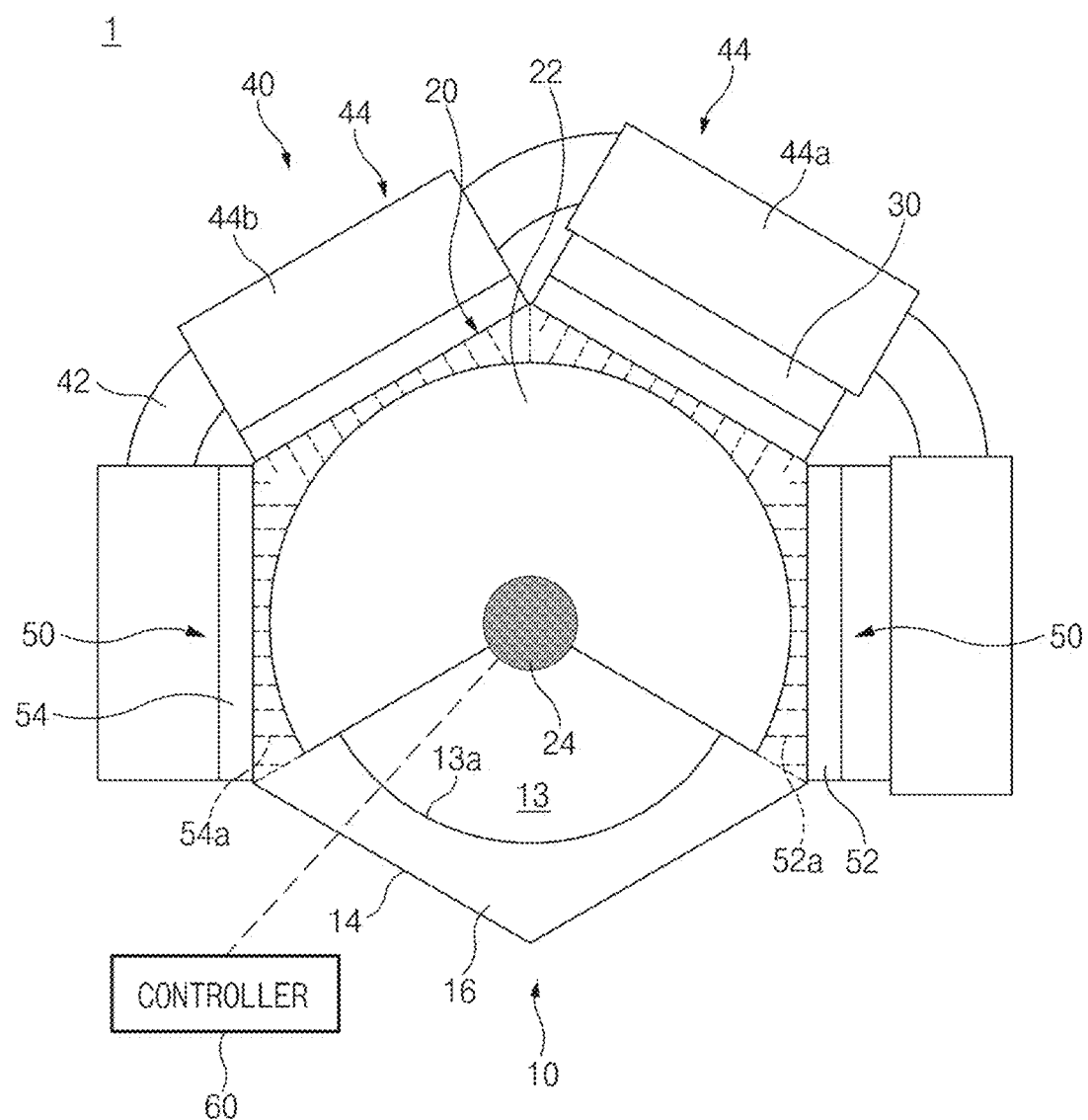
Figure 7:
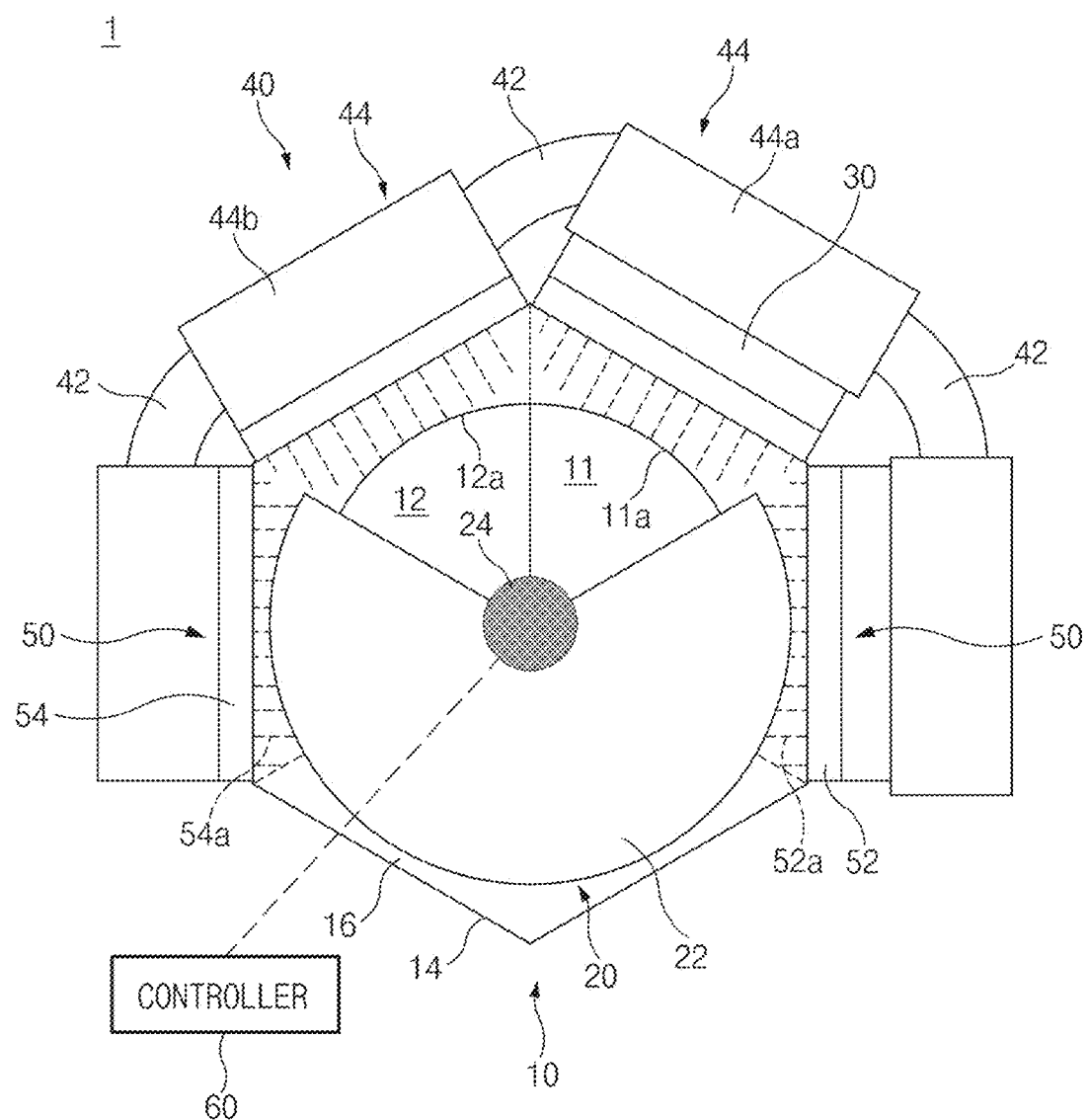
Figure 8:
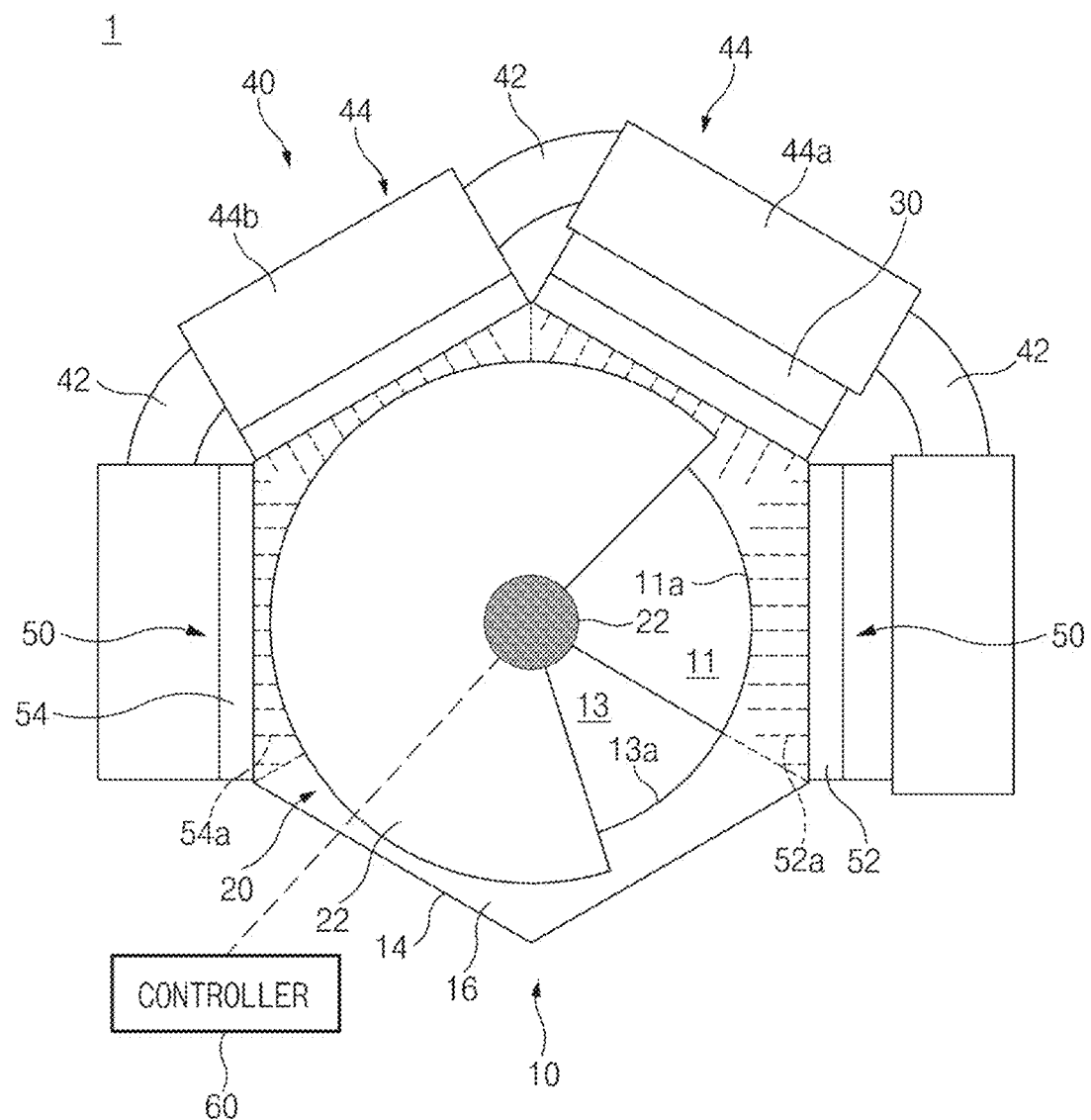

Further, referring to FIG. 6, the controller 60 may be configured to operate the valve 20 to open the third inlet 13a while the first inlet 11a and the second inlet 12a are closed, when a temperature of the thermoelectric module 30 is equal to or greater than a predetermined reference power generation limit temperature (by-pass mode). Then, the exhaust gas E flowing along the exhaust pipe 70 may be re-transmitted to the exhaust pipe 70 through the third outlet 13b after being selectively introduced into the third branch fluid passage 13 through the third inlet 13a. The third branch fluid passage 13 may be thermally isolated from the thermoelectric module 30 and the cooling fluid pipe 42. Accordingly, in the by-pass mode, the exhaust heat of the exhaust gas E may pass through the third branch fluid passage 13 to be re-transmitted to the exhaust pipe 70 without being lost by the thermoelectric module 30 and the cooling fluid C.

The reference power generation limit temperature is not specially limited. For example, the temperature of the thermoelectric module 30, which causes thermal damage to the thermoelectric devices or other parts disposed in the thermoelectric module 30 due to higher heat, may be set to the reference power generation limit temperature. The reference power generation limit temperature may vary depending on an environment condition such as the material of the thermoelectric devices. Although the temperature of the thermoelectric module 30 may be sensed by the temperature sensor (not illustrated) installed in the thermoelectric module 30, the present disclosure is not limited thereto. In addition, the temperature of the thermoelectric module 30 may be a temperature of a first end of a thermoelectric device configured to receive the exhaust heat of the exhaust gas E, but the present disclosure is not limited thereto. In the by-pass mode, the thermoelectric device or other parts disposed in the thermoelectric module 30 may be prevented from being damaged due to higher heat.

Meanwhile, the thermoelectric power generation using the thermoelectric module 30 starts when the temperature of the coolant passing through the cooling fluid pipe 42 reaches the reference warm-up temperature, but the present disclosure is not limited thereto. For example, referring to FIG. 7, the controller 60 may be configured to operate the valve 20 to partially open the first inlet 11a and the second inlet 12a while a remaining portion of the first inlet 11a, a remaining portion of the second inlet 12a, and the entire portion of the third inlet 13a are closed, when the temperature of the cooling fluid C passing through the cooling fluid pipe 42 is equal to or greater than a predetermined first mode switch temperature and is less than the reference warm-up temperature (e.g., a first mixing mode).

Further, the exhaust gas E flowing along the exhaust pipe 70 may be divided into two parts, introduced into the first branch fluid passage 11 and the second branch fluid passage 12 through the first inlet 11a and the second inlet 12a, and re-transmitted to the exhaust pipe 70 through the first outlet 11b and the second outlet 12b. In the first mixing mode, the thermoelectric power generation may be performed using the exhaust heat of the exhaust gas E passing through the first branch fluid passage 11 while the cooling fluid C is heated by the exhaust heat of the exhaust gas E passing through the second branch fluid passage 12.

The first mode switch temperature is not specially limited. For example, the first mode switch temperature may be set to the temperature of the cooling fluid C generated when the temperature of the cooling fluid C is determined to be increased to the reference temperature using only latent heat of the second heat exchanger 54 and exhaust heat less than exhaust heat used in the cooling fluid warm-up mode, as the temperature of the cooling fluid C is increased to an approximate value to the reference warm-up temperature.

In particular, the open amount of the first inlet 11a and the open amount of the second inlet 12a are not specially limited. For example, the controller 60 may be configured to operate the valve 20 to gradually increase the open amount of the first inlet 11a while the open amount of the second inlet 12a gradually decreases, as the temperature of the cooling fluid C approximates the reference warm-up temperature. In the first mixing mode, since the starting time of the thermoelectric power generation is advanced, the recovery rate of the exhaust heat of the exhaust gas E may be further improved.

Moreover, although the thermoelectric power generation using the thermoelectric module 30 is terminated when the temperature of the thermoelectric module 30 reaches the reference power generation limit temperature, the present disclosure is not limited thereto. For example, referring to FIG. 8, the controller 60 may be configured to operate the valve 20 to partially open the first inlet 11a and the third inlet 13a while a remaining portion of the first inlet 11a, a remaining portion of the third inlet 13a and an entire portion of the second inlet 12a are closed, when the temperature of the thermoelectric module 30 is equal to or greater than the reference power generation limit temperature and is less than a second mode switch temperature (e.g., a second mixing mode). In other words, the first inlet 11a and the third inlet 13a are partially opened while the second inlet 12a is maintained in a closed position. Then, the exhaust gas E flowing along the exhaust pipe 70 may be divided into two parts, introduced into the first branch fluid passage 11 and the third branch fluid passage 13 through the first inlet 11a and the third inlet 13a, and retransmitted to the exhaust pipe 70 through the first outlet 11b and the third outlet 13b. In the second mixing mode, the thermoelectric power generation may be performed using exhaust heat of any a portion of the exhaust gas E while another portion of the exhaust gas E is passed without the recovery of the exhaust heat.

The second mode switch temperature is not specially limited. For example, the second mode switch temperature may be set to the temperature of the thermoelectric module 30 which is determined not to thermally damage thermoelectric devices or other parts disposed in the thermoelectric module 30 when the thermoelectric power generation is performed using only the exhaust heat of the exhaust gas E less than the exhaust heat used in the thermoelectric power generation mode.

The open amount of the first inlet 11a and the open amount of the third inlet 13a are not specially limited. For example, the controller 60 may be configured to operate the valve 20 to gradually decrease the open amount of the first inlet 11a while gradually increasing the open amount of the third inlet 13a as the temperature of the thermoelectric module 30 approximates the second mode switch temperature. In the second mixing mode, since the termination time of the thermoelectric power generation is delayed, the recovery rate of the exhaust heat of the exhaust gas E may be further improved.

As described above, the exhaust heat recovery system may be configured to open or close each of the branch fluid passages 11, 12, and 13 using the valve 20 to variously change the manner of recovering the exhaust heat of the exhaust gas E. According to the exhaust heat recovery system 1, the manner of recovering the exhaust heat may be changed depending on environment conditions such as the driving time and the driving aspect of a vehicle, thereby maximizing the recovery rate of the exhaust heat of the exhaust gas E.

In addition, the exhaust heat recovery system 1 may be configured to adjust the manner of recovering the exhaust heat by opening or closing the branch fluid passages 11, 12, and 13 using a single valve 20 since the branch fluid passages 11, 12, and 13, which are individually coupled to mutually different exhaust heat recovery devices such as the thermoelectric module 30 and the cooling member 40, may be formed integrally with each other inside a single branch pipe 10. Accordingly, in the exhaust heat recovery system 1, an integral structure may be provided such that multiple exhaust heat recovery devices are integrated with each other, and the number of valves necessary for the switch between fluid passages for the exhaust gas E and the number of parts necessary for the installation of other exhaust heat recovery devices may be reduced. In the exhaust heat recovery system 1, the structure of the exhaust heat recovery system 1 is realized in the more compact size to reduce the volume, the weight, and the installation costs of the exhaust heat recovery system 1 and to improve the fuel efficiency of the vehicle.

As described above, the present disclosure relates to an exhaust heat recovery system and has the following effects.

First, the present disclosure may maximize the recovery rate of the exhaust heat of the exhaust gas by variously changing the manner of recovering the exhaust heat depending on the environmental condition, such as the driving time or the driving aspect of the vehicle.

Second, the present disclosure may reduce the volume, the weight, and the installation costs of the exhaust heat recovery system and may improve the fuel efficiency of the vehicle, as the exhaust heat recovery system is realized in a more compact structure by integrating the multiple exhaust heat recover devices with each other.

Hereinabove, although the present disclosure has been described with reference to exemplary embodiments and the accompanying drawings, the present disclosure is not limited thereto, but may be variously modified and altered by those skilled in the art to which the present disclosure pertains without departing from the spirit and scope of the present disclosure claimed in the following claims. Therefore, exemplary embodiments of the present disclosure are not intended to limit the technical spirit of the present disclosure, but provided only for the illustrative purpose. The scope of protection of the present disclosure should be construed by the attached claims, and all equivalents thereof should be construed as being included within the scope of the present disclosure.

What is claimed is:

1. An exhaust heat recovery system, comprising:
   a branch pipe having branch fluid passages formed to be connected with an exhaust gas source emitting emit exhaust gas;
   a valve configured to at least partially open or close the branch fluid passages to selectively introduce the exhaust gas into at least one of the branch fluid passages; and
   a thermoelectric module configured to perform thermoelectric power generation by selectively using exhaust heat of the exhaust gas passing through a specific branch fluid passage of the branch fluid passages,
   wherein the branch fluid passages include inlets connected with the exhaust gas source, respectively,
   wherein the valve selectively opens the inlet of at least one of the branch fluid passages while selectively closing remaining branch fluid passages of the branch fluid passages,
   wherein the valve includes a cover plate disposed to selectively cover the inlets of the remaining branch fluid passages to close the inlets,
   wherein the branch fluid passages are arranged radially from a central portion of the branch pipe, and
   wherein the cover plate has a sector shape.

2. The exhaust heat recovery system of claim 1, wherein the branch pipe further includes:
   an outer wall having an exhaust fluid passage formed in the outer wall; and
   a partition which partitions the exhaust fluid passage into the branch fluid passages.

3. The exhaust heat recovery system of claim 2, wherein the thermoelectric module is coupled to a specific position of the outer wall to receive the exhaust heat of the exhaust gas passing through the specific branch fluid passage.

4. The exhaust heat recovery system of claim 1, wherein the valve further includes:
   a driving motor configured to pivotally drive the cover plate about the central portion of the branch pipe.

5. An exhaust heat recovery system, comprising:
   a branch pipe having branch fluid passages formed to be connected with an exhaust gas source emitting emit exhaust gas;
   a valve configured to at least partially open or close the branch fluid passages to selectively introduce the exhaust gas into at least one of the branch fluid passages;
   a thermoelectric module configured to perform thermoelectric power generation by selectively using exhaust heat of the exhaust gas passing through a specific branch fluid passage of the branch fluid passages;
   a cooling fluid pipe through which a cooling fluid passes; and
   a controller configured to operate the valve,
   wherein the branch fluid passages include a first branch fluid passage and a second branch fluid passage,
   wherein the thermoelectric module is installed to perform the thermoelectric power generation using the exhaust heat of the exhaust gas passing through the first branch fluid passage,
   wherein the cooling fluid pipe includes:
      a first section disposed such that the thermoelectric module and the cooling fluid exchange heat with each other; and
      a second section disposed such that the exhaust gas passing through the second branch fluid passage and the cooling fluid exchange heat with each other, and
   wherein the controller is configured to operate the valve to partially open the first branch fluid passage and the second branch fluid passage, when a temperature of the cooling fluid is equal to or greater than a predetermined first mode switch temperature and is less than a predetermined reference warm-up temperature.

6. The exhaust heat recovery system of claim 5,
   wherein the controller is configured to operate the valve to close the first branch fluid passage while the second branch fluid passage is opened, when the temperature of the cooling fluid is less than the predetermined reference warm-up temperature.

7. The exhaust heat recovery system of claim 6, wherein the controller is configured to operate the valve to open the first branch fluid passage while the second branch fluid passage is closed, when the temperature of the cooling fluid is equal to or greater than the predetermined reference warm-up temperature.

8. The exhaust heat recovery system of claim 7, wherein the branch fluid passages further include a third branch fluid passage, and wherein the controller is configured to operate the valve to open the third fluid passage while the first branch fluid passage and the second branch fluid passage are closed, when a temperature of the thermoelectric module is equal to or greater than a predetermined reference power generation limit temperature.

9. The exhaust heat recovery system of claim 8, wherein the controller is configured to operate the valve to partially open the first branch fluid passage and the third branch fluid passage while the second branch fluid passage is closed, when the temperature of the thermoelectric module is equal to or greater than the predetermined reference power generation limit temperature and is equal to less than a second mode switch temperature.

10. The exhaust heat recovery system of claim 9, wherein the controller is configured to operate the valve to decrease an open amount of a first inlet while increasing an open amount of a third inlet, as the temperature of the thermoelectric module approximates the second mode switch temperature.

11. The exhaust heat recovery system of claim 8, wherein the first branch fluid passage, the second branch fluid passage, and the third branch fluid passage are arranged radially from the central portion of the branch pipe.

12. The exhaust heat recovery system of claim 5, wherein the controller is configured to operate the valve to increase an open amount of a first inlet while decreasing an open amount of a second inlet, as the temperature of the cooling fluid approximates the predetermined reference warm-up temperature.

* * * * *